United States Patent [19]

Abe et al.

[11] Patent Number: 4,965,483

[45] Date of Patent: Oct. 23, 1990

[54] PIEZOELECTRIC BUZZER

[75] Inventors: Toshio Abe; Seiichi Takahashi; Masaharu Kamihara; Hitoshi Saito; Seizo Tanaka; Yasuyuki Suzuki, all of Tokyo, Japan

[73] Assignee: TDK Corporation, Tokyo, Japan

[21] Appl. No.: 322,580

[22] Filed: Mar. 13, 1989

[30] Foreign Application Priority Data

| | | | |
|---|---|---|---|
| Mar. 17, 1988 | [JP] | Japan | 63-35949[U] |
| Jul. 8, 1988 | [JP] | Japan | 63-91091[U] |
| Jul. 8, 1988 | [JP] | Japan | 63-171574 |
| Sep. 9, 1988 | [JP] | Japan | 63-119141[U] |
| Oct. 13, 1988 | [JP] | Japan | 63-134274[U] |

[51] Int. Cl.[5] .............................................. H01L 41/08

[52] U.S. Cl. .................................... 310/324; 310/345; 310/356; 381/190

[58] Field of Search ................ 310/324, 345, 354–356; 381/190

[56] References Cited

U.S. PATENT DOCUMENTS

| | | | |
|---|---|---|---|
| 3,222,462 | 12/1965 | Karmann et al. | 310/331 X |
| 3,643,305 | 2/1972 | Furnival | 310/352 X |
| 4,122,365 | 10/1978 | Stephens | 310/324 |
| 4,190,784 | 2/1980 | Massa | 310/324 |
| 4,302,695 | 11/1981 | Boyles et al. | 310/324 |
| 4,420,706 | 12/1983 | Siebold et al. | 310/324 |
| 4,602,245 | 7/1986 | Yang et al. | 310/324 X |

FOREIGN PATENT DOCUMENTS

| | | |
|---|---|---|
| 0188017 | 7/1986 | European Pat. Off. . |
| 2128399 | 4/1984 | United Kingdom . |

*Primary Examiner*—Mark O. Budd
*Attorney, Agent, or Firm*—Brumbaugh, Graves, Donohue & Raymond

[57] ABSTRACT

A piezoelectric buzzer comprising a case having the shape of a bottomed cylinder, a piezoelectric diaphragm fixedly disposed within the case, a cover plate fitted in the open end of the case, and terminals integrally combined with the cover plate and each having one end in contact with the piezoelectric diaphragm and the other end projecting outside from the cover plate. Since the cover plate and the terminals are combined together by insert molding, no gap is formed between the cover plate and the terminals, no sealing work for sealing gaps between the cover plate and the terminals is necessary, the manufacturing process is simplified, and the piezoelectric element is not exposed to the external atmosphere. A method of manufacturing such a piezoelectric buzzer comprises steps of arranging a plurality of metallic strips for forming terminals in parallel to each other, forming notches in one side of each metallic strip at predetermined intervals, simultaneously forming a plurality of cover plates integrally combined with the metallic strips by insert molding, cutting the metallic strips at predetermined positions between the adjacent cover plates, and bending the metallic strips projecting from each cover plate at the notches to form terminals. The metallic strips can be easily bent at the notches to form the terminals after being combined with the cover plates by insert molding without requiring special work for deciding positions where the metallic strips are to be bent.

7 Claims, 10 Drawing Sheets

FIG. 24
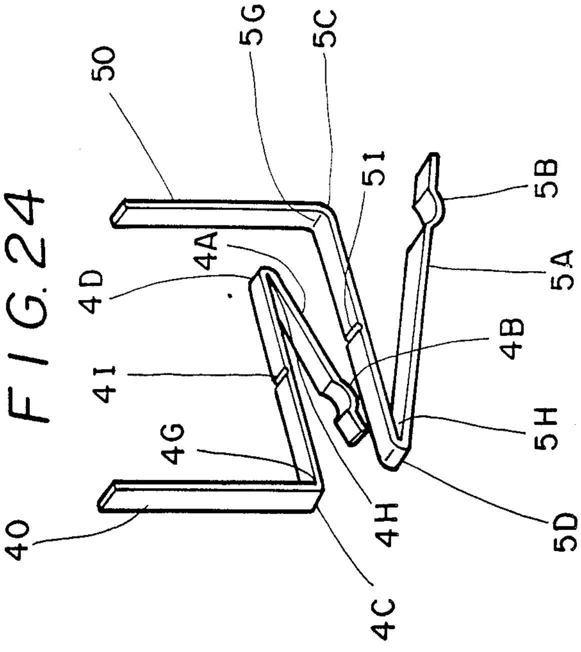
FIG. 21
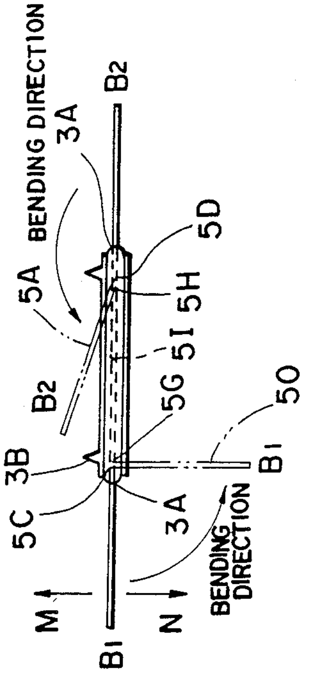
FIG. 22
FIG. 23
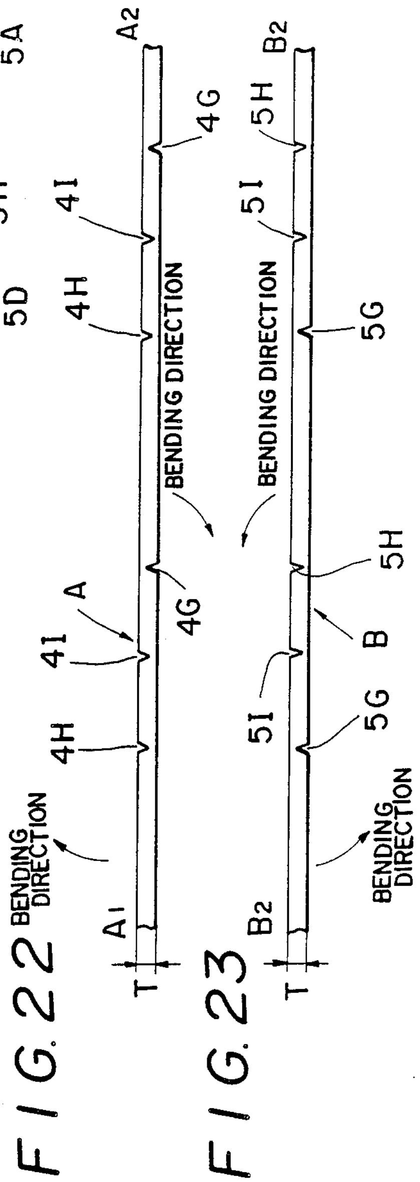

PIEZOELECTRIC BUZZER

BACKGROUND OF THE INVENTION

1. Field of the Invention

The present invention relates to a piezoelectric buzzer and a method of manufacturing the same.

2. Description of the Prior Art

A piezoelectric buzzer as shown in FIG. 1 is disclosed in Japanese Utility Model Publication No. 63-1518.

This known piezoelectric buzzer 10 comprises a case 11 provided with a sound radiating hole 11*a*; a cover plate 12 provided with square holes 13 and 14, a composite piezoelectric sound source 15 consisting of a metallic plate 15*a* disposed within and held on the case 11, and a piezoelectric element 15*b*; and terminals 16 inserted through the square holes 13 and 14 in the case 11 and respectively in elastic contact with the metallic plate 15*a* and the piezoelectric element 15*b*.

However, this piezoelectric buzzer 10 has problems that the piezoelectric element 15*b* is exposed to the external atmosphere and thereby the characteristics of the piezoelectric element 15*b* are deteriorated, since gaps are formed between the terminals 16 and the cover plate 12 when the terminals 16 are inserted respectively in the square holes 13 and 14 and that it is impossible to prevent perfectly the penetration of flux through the gaps into the interior of the piezoelectric buzzer 10 in soldering the piezoelectric buzzer 10 to a base plate. Such problems may be solved by sealing the gaps, however, it is difficult to seal the gaps perfectly. Furthermore, the piezoelectric buzzer 10 has disadvantages that the piezoelectric buzzer 10 requires much time and labor in manufacturing and assembling the parts thereof for forming the square holes 13 and 14 in the cover plate 12, attaching the terminals 16 to the cover plate 12 and sealing the gaps.

SUMMARY OF THE INVENTION

Accordingly, it is an object of the present invention to provide a piezoelectric buzzer requiring no work for forming holes in a cover plate and sealing gaps, capable of containing a piezoelectric element in a case in an airtight fashion to prevent the deterioration of the characteristics of the piezoelectric element and the penetration of flux into the interior of the case, and capable of being efficiently assembled.

It is another object of the present invention to provide a method of manufacturing such a piezoelectric buzzer.

In a first aspect of the present invention, a piezoelectric buzzer comprises a bottomed case, a cover plate fitted in the open end of the case, a piezoelectric diaphragm fitted in the case, and terminals in contact with the piezoelectric diaphragm and projecting outside through the cover plate, in which the cover plate and the terminals are formed integrally by insert molding.

In a second aspect of the present invention, a piezoelectric buzzer has a case and a cover plate provided respectively with annular ridges in the respective inner surfaces thereof, and a piezoelectric diaphragm is held between the annular ridges which are in line contact with the piezoelectric diaphragm.

In a third aspect of the present invention, a piezoelectric buzzer has a case and a cover plate respectively provided with annular ridges in the respective inner surfaces thereof, and a piezoelectric diaphragm is held between the annular ridges with an elastic member interposed between the annular ridge of the case and the piezoelectric diaphragm.

In a fourth aspect of the present invention, a piezoelectric buzzer has terminals respectively having curved free ends in contact with a piezoelectric diaphragm.

In a fifth aspect of the present invention, a piezoelectric buzzer has terminals having the shape of a strip, and each terminal has a plurality of longitudinally sequential curved portions in the free end thereof.

In a sixth aspect of the present invention a piezoelectric buzzer has a case and a cover plate, fitting structure consisting of an annular groove formed in the inner surface of the side wall of the case, and a flange formed in the circumference of the cover plate.

In a seventh aspect of the present invention, a piezoelectric buzzer has a case, and the inner edge of the free end of the case or the edge of the inner surface of the cover plate is chamfered to form a conical surface.

In an eighth aspect of the present invention, a method of manufacturing a piezoelectric buzzer comprises steps of arranging a plurality of metallic strips for forming terminals in parallel to each other; forming notches at predetermined intervals in one side of each metallic strip; molding a resin to form a plurality of cover plates combined with the metallic strips at regular intervals; cutting the metallic strips in a predetermined length; and bending the metallic strips at the notches.

Since the terminals and the cover plate are formed integrally by insert molding, no gap is formed therebetween. Accordingly the work necessary for sealing the gaps between the terminals and the cover plate in manufacturing the conventional piezoelectric buzzer is eliminated to simplify the manufacturing process and the terminals are combined fixedly with the cover plate.

Since the piezoelectric diaphragm is held between the case and the cover plate which are in line contact with the piezoelectric diaphragm, the vibration of the piezoelectric diaphragm is not attenuated by the case and the cover plate.

The provision of the elastic member the annular ridge of the case and the piezoelectric diaphragm enables the piezoelectric diaphragm to be held securely between the case and the cover plate without any play, even if irregularities are formed in the annular ridges of the case and the cover plate.

The curved free ends of the terminals secure a sufficient contact area between the terminals and the piezoelectric diaphragm.

The plurality of curved portions of the terminals enhance the pressure of contact of the curved contact portions of the terminals on the piezoelectric element and metallic plate of the piezoelectric diaphragm to prevent faulty contact between the piezoelectric diaphragm and the terminals.

The fitting structure including the annular groove formed in the case and the flange formed in the circumference of the cover plate facilitate assembling the case and the cover plate.

The conical surface formed in the inner edge of the free end of the case or in the edge of the inner surface of the cover plate facilitates fitting the cover plate in the case.

The notches formed in the metallic strips facilitate bending the terminals after combining the metallic strips and the cover plate by insert molding.

BRIEF DESCRIPTION OF THE DRAWINGS

FIGS. 18 to 24 are views of assistance in explaining a method of manufacturing the piezoelectric buzzer of FIG. 2, in which:

FIGS. 18 and 19 are plan views of assistance in explaining steps of forming the cover plate integrally having the terminals;

FIGS. 20 and 21 are side elevations of assistance in explaining steps of bending the terminal;

FIGS. 22 and 23 are side elevations of assistance in explaining the arrangement of notches formed in metallic strips for forming the terminals; and FIG. 24 is a perspective view of the terminals.

DESCRIPTION OF THE PREFERRED EMBODIMENTS

Figure 1:
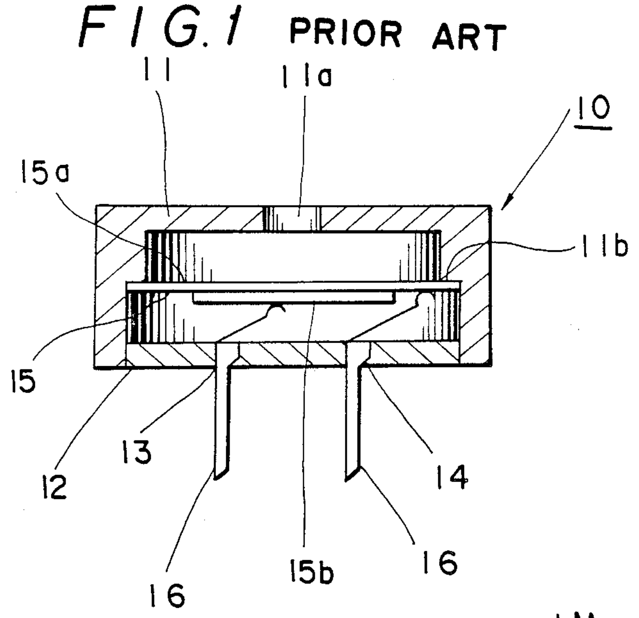
FIG. 1 PRIOR ART
FIG. 1 is a sectional view of a conventional piezoelectric buzzer.
Figure 2:
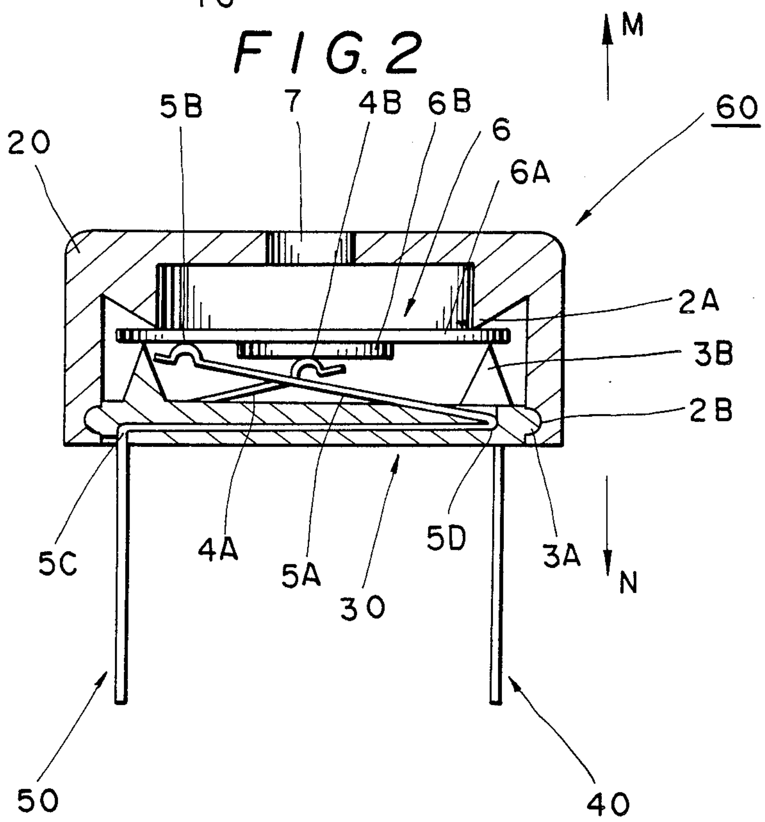
FIG. 2 is a sectional view of a piezoelectric buzzer in a first embodiment according to the present invention.
Figure 3:
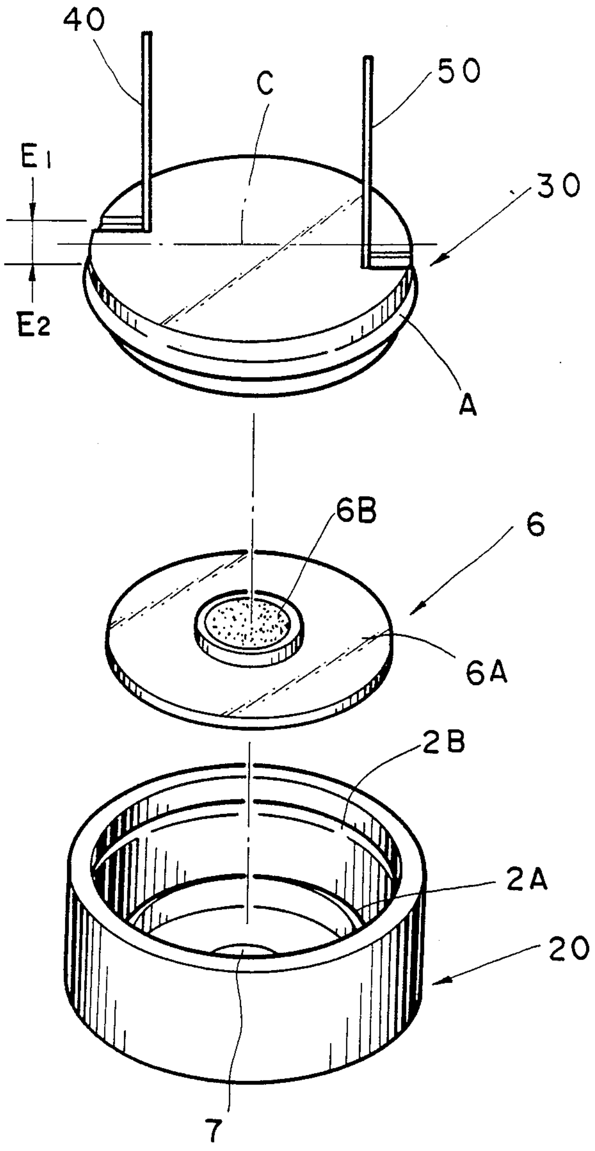
FIG. 3 is an exploded perspective view of the piezoelectric buzzer of FIG. 2.

First Embodiment:

Referring to FIGS. 2 and 3, a piezoelectric buzzer indicated generally at 60 comprises a case 20, a cover plate 30 fitted in the open end of the case 20, a piezoelectric diaphragm 6 consisting of a metallic plate 6*a* held in place within the case 20 and a piezoelectric element 6*b* adhesively fixed to the metallic plate 6*a* by an anaerobic adhesive, and two terminal 40 and 50 combined integrally with the cover plate 30 by insert molding.

The case 20 is a bottomed tubular member formed of a synthetic resin. A sound radiating hole 7 is formed in the central portion of the bottom wall of the case 20. A shoulder is formed in the inner surface of the side wall of the case 20 between a thicker portion of the side wall on the side M of the bottom wall and a thinner portion of the side wall on the side N of the open end, and the shoulder is protruded toward the side N to form an annular ridge 2A. An annular groove 2B is formed in the thinner portion of the side wall of the case 20 near the open end.

The cover plate 30 is formed of a synthetic resin generally in the shape of a disk. The cover plate 30 has an annular ridge 3B formed in the inner surface, i.e., the upper surface as viewed in FIG. 2, thereof, and a flange 3A extending from the circumference thereof so as to be fitted in the annular groove 2B of the case 20 when the cover plate 30 is put on the case 20. Metallic terminals 40 and 50 are incorporated integrally into the cover plate 30 by insert molding.

Figure 4:
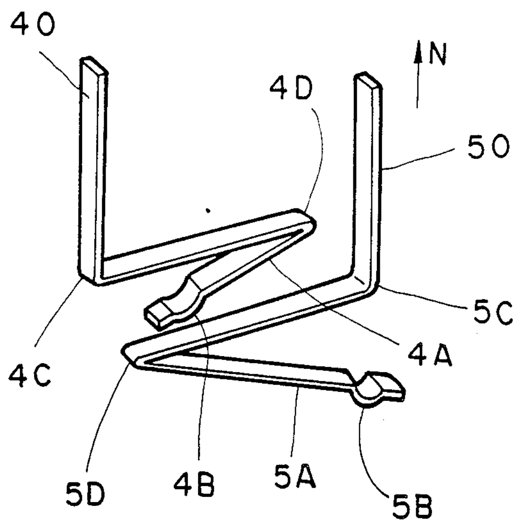
FIG. 4 is a perspective view of terminals employed in the piezoelectric buzzer of FIG. 2.

Referring to FIG. 4, the terminals 40 and 50 have straight legs which extend outside from the cover plate 30, and elastic contact tongues 4A and 5A, respectively. Curved parts 4B and 5B formed respectively at the free ends of the elastic contact tongues 4A and 5A are brought into contact with a the piezoelectric element 6B and the metallic plate 6A, respectively. The terminal 40 is bent at two bends 4C and 4D, and the terminal 50 is bent at two bends 5C and 5D.

As shown in FIGS. 2 and 3, the metallic plate 6A fixedly holding the piezoelectric element 6B is placed within the case 20 on the annular ridge 2A with the piezoelectric element 6B on the side N. When the cover plate 30 is fitted in the case 20 from the side N so that the flange 3A is received fitly in the annular groove 2B, the metallic plate 6A is held between the annular ridge 2A of the case 20 and the annular ridge 3B of the cover plate 30. The annular ridges 2A and 3A are in line contact with the metallic plate 6A.

When the cover plate 30 is thus fitted in the case 20 after placing the metallic plate 6A fixedly holding the piezoelectric element 6B on the annular ridge 2A of the case 20, the flange 3A of the cover plate 30 is received in an airtight fashion in the annular groove 2B of the case 20, and the metallic plate 6A is held in the peripheral portion thereof between and in line contact with the annular ridge 2A of the case 20 and the annular ridge 3B of the cover plate 30.

Figure 5:
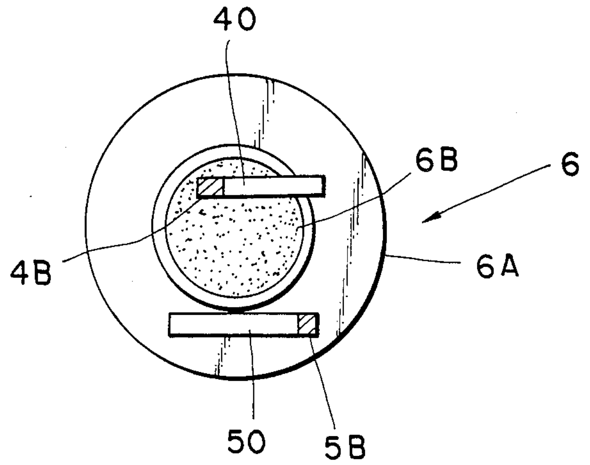
FIG. 5 is a plan view showing the terminals in contact with a piezoelectric diaphragm in the piezoelectric buzzer of FIG. 2.
Figure 6:
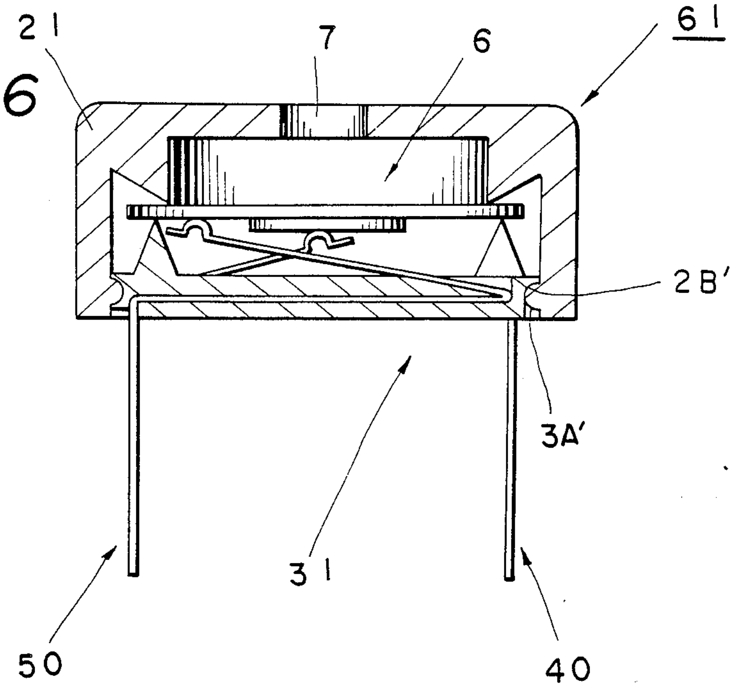
FIG. 6 is a sectional view of a modification of the piezoelectric buzzer of FIG. 2.

Since the terminals 40 and 50 are positioned on opposite sides with respect to a diameter C of the cover plate 30 at distances $E_1$ and $E_2$ from the diameter C, respectively, as shown in FIGS. 3 and 4, the curved parts 4B and 5B of the terminals 40 and 50 are in contact only with the piezoelectric element 6B and the metallic plate 6A, respectively, as shown in FIG. 5. In FIG. 5, hatched portions are contact surfaces of the curved parts 4B and 5B of the terminals 40 and 50, respectively.

Since the cover plate 30 and the terminals 40 and 50 are combined closely together by insert molding the cover plate 30 and the terminals 40 and 50, no gap is formed between the cover plate 30 and the terminals 40 and 50. Accordingly, any additional work, such as sealing work, is not necessary in manufacturing the piezoelectric buzzer, and hence the component parts of the piezoelectric buzzer can easily be manufactured and the piezoelectric buzzer can easily be assembled. Since the cover plate 30 is attached to the case 20 by pressing the cover plate 30 into the case 20 so that the flange 3A of the cover plate 30 engage the annular groove 2B of the case 20 in an airtight fashion, the piezoelectric element 6B is never exposed to the external atmosphere, the characteristics of the piezoelectric element 6B are not deteriorated by the external atmosphere, and flux is not allowed to penetrate into the interior of the case 2.

Simultaneously forming a plurality of combinations each of the cover plate 30 and the terminals 40 and 50 by subjecting two parallel metallic strips for forming the plurality of terminals 40 and 50 to insert molding is suitable for mass-producing the piezoelectric buzzers.

The straight legs of the terminals 40 and 50 need not necessarily be extended perpendicularly to the cover plate 30. In a modification, the terminals 40 and 50 may be extended in circumferential directions, and the curved parts 4B and 5B of the terminals 40 and 50 may be formed in a semicircular shape.

Furthermore, it is also possible to omit the annular ridge 3B of the cover plate 30, and the metallic plate 6A may be pressed against the annular ridge 2A of the case 20 by the resilient forces of the terminals 40 and 50.

Still further, it is also possible to form an annular protrusion 2B' in the inner surface of the case 20 near the open end of the same and to form a complementary annular groove 3A' in the circumference of the cover plate 30 for fity receiving the annular protrusion of the case 20 instead of forming the annular groove 2B in the case 20, and the flange 3A in the cover plate 30.

Figure 7:
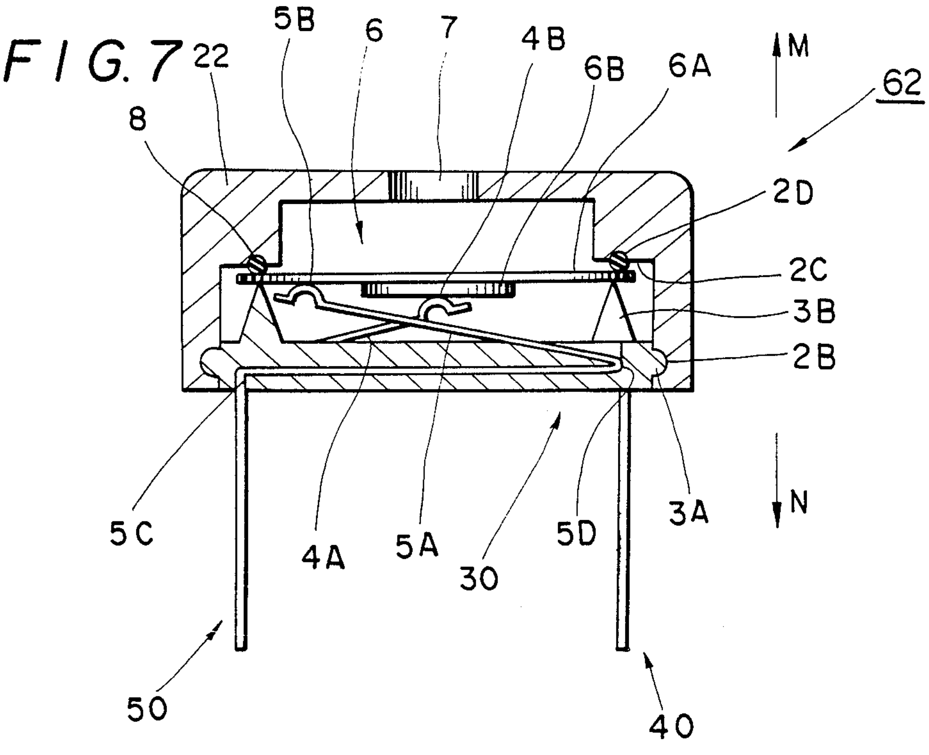
FIG. 7 is a sectional view of a piezoelectric buzzer in a second embodiment according to the present invention.

Second Embodiment:

Referring to FIG. 7, a piezoelectric buzzer 62 in a second embodiment according to the present invention comprises a case 22, a piezoelectric diaphragm 6 consisting of a metallic plate 6A and a piezoelectric element 6B attached to the central portion of the metallic plate 6A, a cover plate 30 fitted in the case 22, and terminals 40 and 50 integrally combined with the cover plate 30. The piezoelectric buzzer 62 in the second embodiment differs from the piezoelectric buzzer 60 in the first embodiment shown in FIG. 2 in that a shoulder 2C is formed in the inner surface of the case 22 instead of the annular ridge 2A, and an annular groove 2D is formed in the shoulder to receive a rubber ring (elastic member) 8 therein. The rest of the component parts of the piezoelectric buzzer 62 are the same as those of the piezoelectric buzzer 60, respectively, and hence component parts and construction which are different from those of the piezoelectric buzzer 60 will be described.

The case 22 is a bottomed tubular member formed of a synthetic resin by injection molding. A sound radiating hole 7 is formed in the central portion of the bottom wall of the case 22. The shoulder 2C is formed between a thicker portion of the side wall of the case 22 on the side M of the bottom wall and a thinner portion of the side wall of the same on the side N of the open end of the case 22, and an annular groove 2B is formed in the inner surface of the case 22 near the open end of the same. The rubber ring 8 is fitted in the annular groove 2D formed in the shoulder 2C.

The cover plate 30 is formed of a synthetic resin by injection molding. In molding the cover plate 30, metallic strips for forming the terminals 40 and 50 are inserted in the mold to combine the metallic strips integrally with the cover plate 30. After thus combining the metallic strips and the cover plate 30, the metallic strips are bent to form the terminals 40 and 50.

Figure 8A:
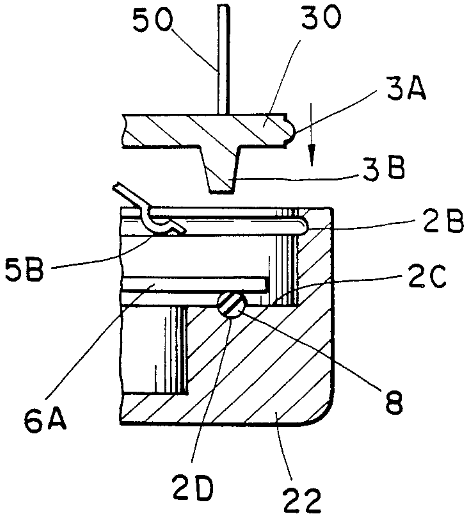
FIGS. 8A and 8B are fragmentary sectional views of essential portions of the piezoelectric buzzer of FIG. 7.
Figure 8B:
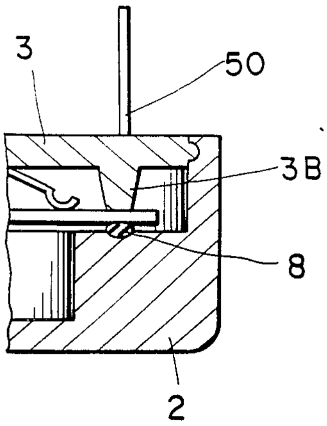

Referring to FIGS. 8A and 8B, the piezoelectric diaphragm 6 consisting of the metallic plate 6A and the piezoelectric element 6B fixed to the metallic plate 6A is put in the case 22 with the piezoelectric element on the side N and is placed on the rubber ring 8 fitted in the annular groove 2D, and then the cover plate 30 is fitted in the case 22 so that the flange 3A is fitted in the annular groove 2B of the case 22. When the cover plate 30 is joined perfectly to the case 22 with the flange 3B engaging the annular groove 2B in an airtight fashion, the rubber ring 8 is compressed resiliently so that the piezoelectric diaphragm 6 is held firmly between the rubber ring 8 and the annular ridge 3B of the cover plate 30, and the curved parts 4B and 5B of the terminals 40 and 50 are pressed against the piezoelectric element 6B and the metallic plate 6A, respectively. Thus, the piezoelectric diaphragm 6 is held securely by the resilience of the rubber ring 8, and hence the lost motion of the piezoelectric diaphragm 6 attributable to errors in the dimensions of the case 22 and the cover plate 30 is prevented.

Figure 9A:
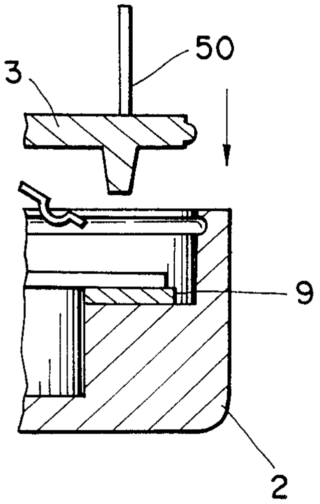
FIGS. 9A and 9B are fragmentary sectional views of a modification of the piezoelectric buzzer of FIG. 7.
Figure 9B:
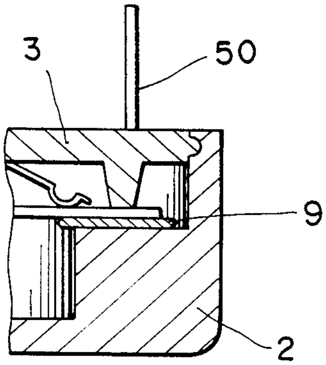

In a modification, the rubber ring 8 may be substituted by an annular rubber plate 9 as shown in FIGS. 9A and 9B. It is also possible to place the rubber ring 8 or the annular rubber plate 9 on the annular ridge 3B of the cover plate 30. Furthermore, rubber rings or annular rubber plates may be provided on both the shoulder 2C and the annular ridge 3B, respectively.

Still further, the case 22 and the cover plate 30 may entirely or partly be formed of an elastic material, or either the case 22 or the cover plate 30 may entirely or partly be formed of an elastic material.

Figure 10:
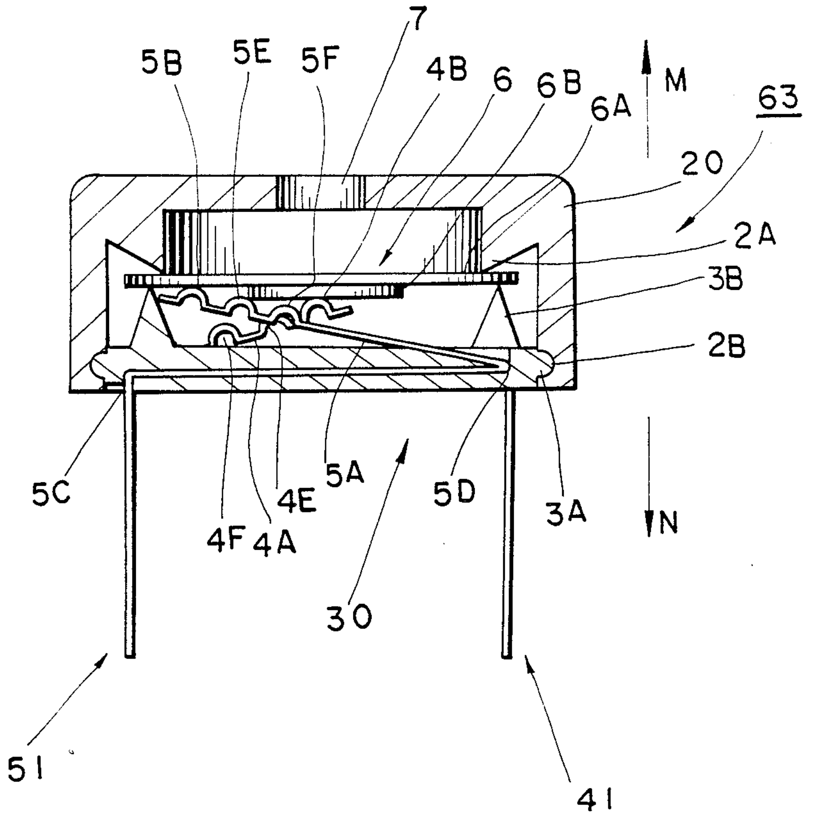
FIG. 10 is a sectional view of a piezoelectric buzzer in a third embodiment according to the present invention.

Third Embodiment:

Referring to FIG. 10, a piezoelectric buzzer 63 in a third embodiment according to the present invention comprises a case 20, a cover plate 30, a piezoelectric diaphragm 6 and terminals 41 and 51. The component parts and construction of the piezoelectric buzzer 63 in the third embodiment excluding the terminals 40 and 50 are the same as the corresponding component parts and construction of the piezoelectric buzzer 60 in the first embodiment, and hence only the terminals 41 and 51 will be described.

The terminals 41 and 51 have straight legs extending outside from the cover plate 30, and elastic contact tongues 4A and 5A, respectively. A plurality of curved parts, in this embodiment, three curved parts 4B, 4E and 4F and three curved parts 5B, 5E and 5F, are formed in the elastic contact tongues 4A and 5A, respectively. The curved parts 4B, 4E, 4F, 5B, 5E and 5F are similar to the curved parts 4B and 5B of the terminals 40 and 50 in the first embodiment. The terminals 41 and 51 have two bends 4C and 4D and two bends 5C and 5D, respectively, in the cover plate 30.

When the cover plate 30 is fitted in the case 20, the curved part 4B formed at the free end of the elastic contact tongue 4A, and the curved part 5B formed at the free end of the elastic contact tongue 5A are pressed respectively against the piezoelectric element 6B and the metallic plate 6A. The curved parts 4B and 5B are pressed against the piezoelectric diaphragm 6 by increased pressures produced by the resiliences of the curved parts 4B, 4E, 4F, 5B, 5E and 5F in addition to those of the elastic contact tongues 4A and 5A.

Figure 11:
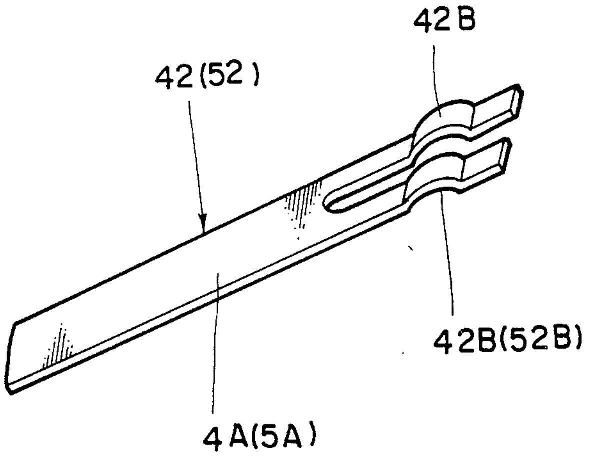
FIGS. 11 and 12 are perspective views of modifications of terminals employed in the piezoelectric buzzer of FIG. 10.
Figure 12:
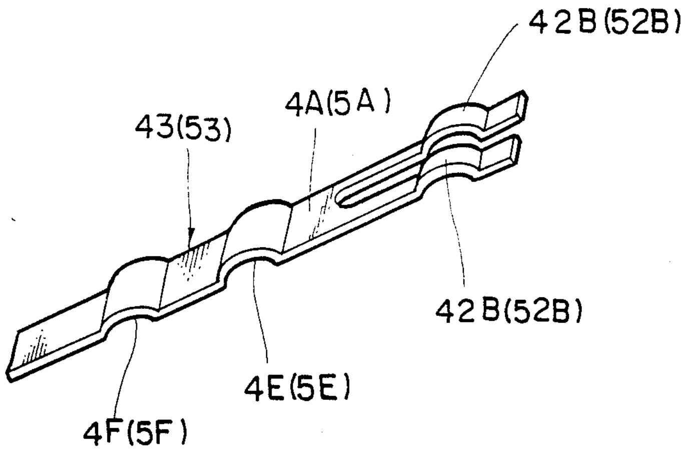

A terminal 42 (52) having an elastic contact tongue 4A (5A) having a bifurcated free end provided with two curved parts 42B (52B) as shown in FIG. 11 or a terminal 43 (53) having an elastic contact tongue 4A (5A) provided with two curved parts 4E and 4F (5E and 5F) and having a bifurcated free end provided with two curved parts 42B (52B) as shown in FIG. 12 may be employed instead of the terminal 41 (51).

Figure 13:
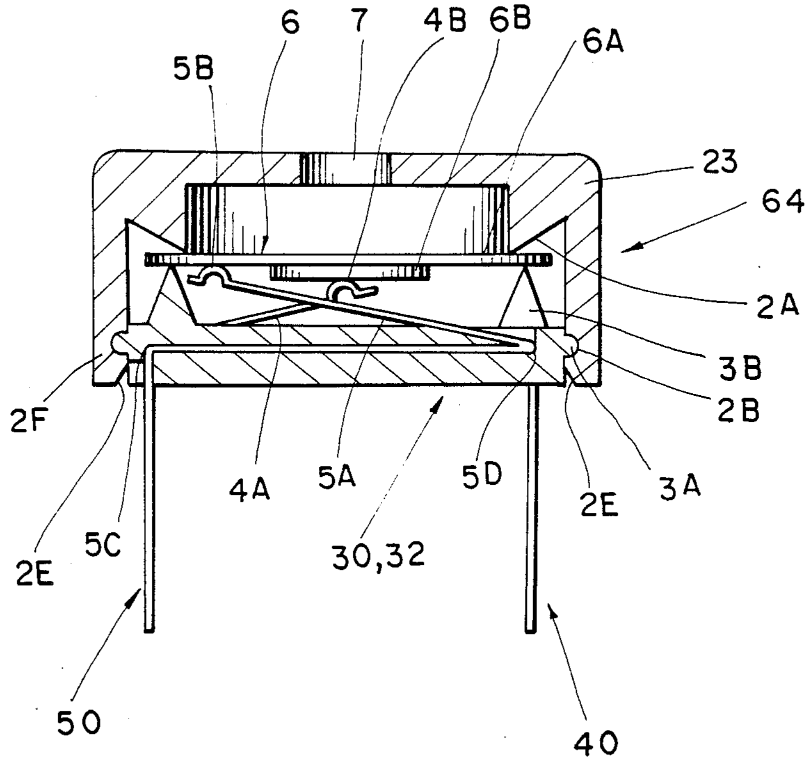
FIG. 13 is a sectional view of a piezoelectric buzzer in a fourth embodiment according to the present invention.

Fourth Embodiment:

Referring to FIG. 13, a piezoelectric buzzer 64 in a fourth embodiment according to the present invention comprises a case 23, a cover plate 30, a piezoelectric diaphragm 5 and terminals 40 and 50. The component parts and construction of the piezoelectric buzzer 64 excluding the case 23 are the same as the corresponding component parts and construction of the piezoelectric buzzer 60 shown in FIG. 2, and hence only the case 23 will be described.

Figure 14:
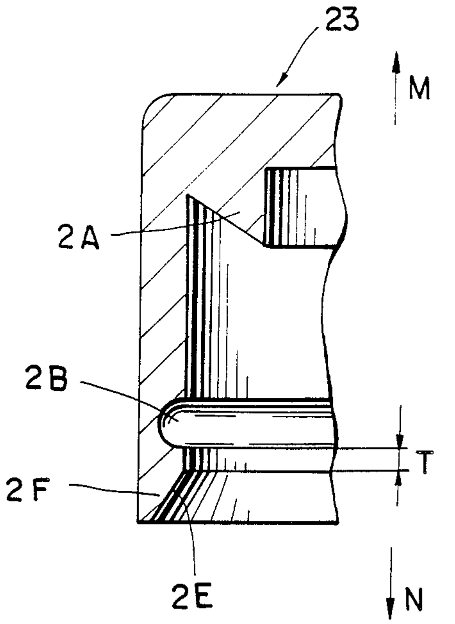
FIG. 14 is an enlarged fragmentary sectional view showing an essential portion of a case employed in the piezoelectric buzzer of FIG. 13.

Referring to FIGS. 13 and 14, the inner edge of the open end 2F of the side wall of the case 23 is chamfered to form a conical surface 2E on the N side of the annular groove 2B. In fitting the cover plate 30 in the case 23, the cover plate 30 is placed on the open end 2F of the side wall of the case 23 with the flange 3A formed in the circumference thereof seated on the conical surface 2E without obstruction, and then an appropriate pressure is applied to the cover plate 30 to fit the flange 3A into the annular groove 2B, so that flange 3A slides smoothly along the conical surface 2E and engages the annular groove 2B. Since the inner edge of the open end of the side wall of the case 23 is chamfered to form the conical surface 2E, the flange 3A of the cover plate 30 must be moved by pressure only through a reduced distance T (FIG. 14), and hence the pressure necessary for fitting the cover plate 30 into the case 23 is smaller than that necessary for fitting the cover plate 30 into the case 20 of the first embodiment, which facilitates the assembling work.

Figure 15:
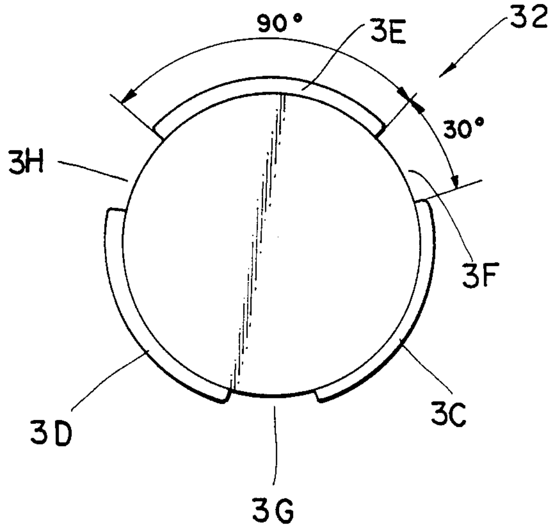
FIG. 15 is a plan view of a modification of a cover plate employed in the piezoelectric buzzer of FIG. 13.

Referring to FIG. 15 showing a modification of the cover plate 30 of the fourth embodiment. A cover plate 32 has an interrupted flange consisting of three sections 3C, 3D and 3E having the shape of a circular arc having a central angle of 90° and arranged at equal angular intervals with gaps 3F, 3G and 3H having a central angle of 30° therebetween.

This cover plate 32 can be easily fitted into the case 23 by a further reduced pressure, since the contact area between the interrupted flange and the inner circumference of the open end 2F of the case 23 is smaller than that between the continuous flange 3A and the inner circumference of the open end 2F of the same case 23.

Figure 16:
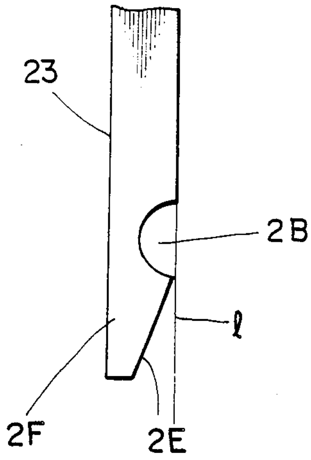
FIGS. 16 and 17 are fragmentary sectional views of modifications of a case employed in the piezoelectric buzzer of FIG. 13.
Figure 17:
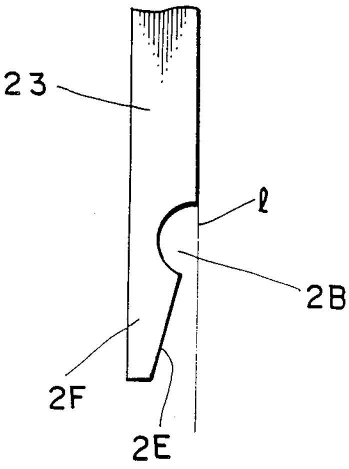

Various modifications are possible in the fourth embodiment. For example, the conical surface 2E may start from the intersection of the extension 1 of the inner circumference of the case 23 and the outer edge of the annular groove 2B as shown in FIG. 16 or the the same may start from a position outside the extension 1 of the inner circumference of the the case 23 as shown in FIG. 17. Furthermore, the number of the sections of the interrupted flange and angular intervals between the sections of the interrupted flange are arbitrary. The cover plate 32 may be used in combination with the case 20 of the first embodiment.

A method of manufacturing a piezoelectric buzzer embodying the present invention will be described hereinafter with reference to FIGS. 2, 3 and 18 to 25.

Figure 18:
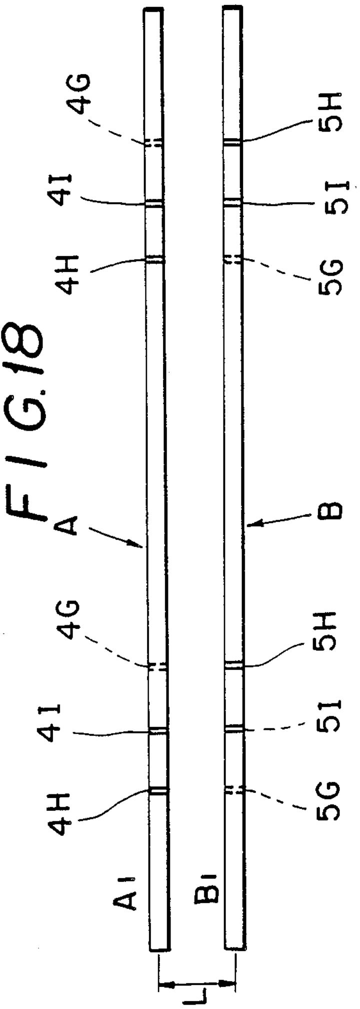

Referring to FIG. 18, notches 4G, 4H, 5G and 5H for forming the bends 4C, 4D, 5C and 5D, and positioning notches 4I and 5I are formed in metallic strips A and B of a thickness t for forming the terminals 40 and 50, respectively. Each positioning notch 4I and each positioning notch 5I are formed between the notches 4G and 4H and between the notches 5G and 5H, respectively. The notches 4G are formed on the opposite sides of the metallic strip A, the notches 5G are formed on the opposite sides of the metallic strip B, the positioning notches 4I are formed on the side of the metallic strip A on which the notches 4H are formed, and the positioning notches 5I are formed on the side of the metallic strip B on which the notches 5H are formed. The number of sets of the notches 4G, 4H and 4I and the number of sets of the notches 5G, 5H and 5I correspond to the number of cover plates 30 to be formed simultaneously.

Figure 19:
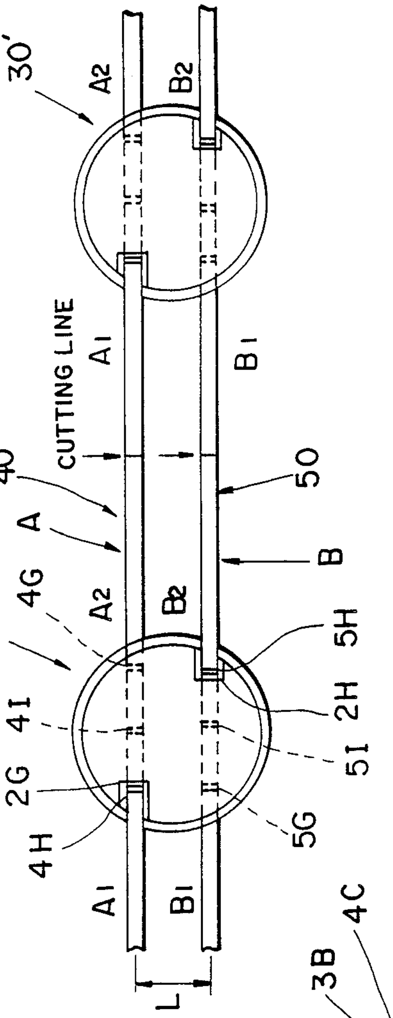

Referring to FIG. 19, in simultaneously producing a plurality of cover plates 30 by injection molding, first, the metallic strips A and B are placed in parallel to each other in a mold, not shown, and then a synthetic resin is injected into the mold to mold a plurality of cover plates 30 (30, 30', . . . ). Then, the metallic strips A and B are cut at cutting line between adjacent cover plates 30 to separate the individual cover plates 30. Thus, the plurality of cover plates 30 each integrally having the two terminals 40 and 50 are obtained. Recesses 2G and 2H are formed on both sides of the cover plate 30 so as to connect to the peripheries of the surfaces, respectively, and to expose the notches 4G, 4H, 5G and 5H so that the metallic strips A and B can be bent at the notches 4G, 4H, 5G and 5H in the following process. The depth, for example, of the recesses 2G and 2H is equal to the distance from the surface of the cover plate 30 to the surfaces of the metallic strips A and B opposite the surfaces of the same in which the notches 4H and 5H are formed. The recesses 2G and 2H must not penetrate through the cover plate 30. The positioning notches 4I and 5I are buried in the cover plate 30.

Figure 20:
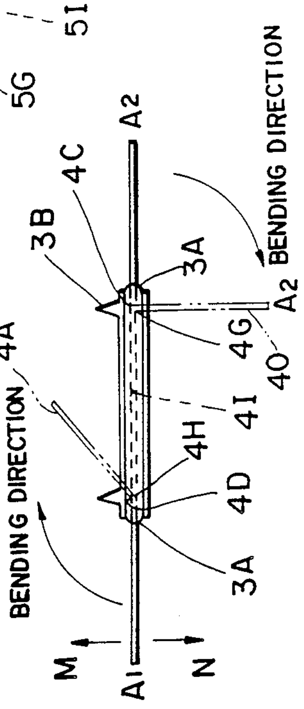

Then, as shown in FIG. 20, one projecting portion $A_1$ of the two projecting portions $A_1$ and $A_2$ of the terminal 40 projecting from the cover plate 30 is bent at the notch 4H at an acute angle to the side M of an annular ridge 3B of the cover plate 30 in a V-shaped bend 4D so that the free end of the projecting portion $A_1$ is on a diameter of the cover plate 30 to form an elastic contact tongue 4A, and the other projecting portion $A_2$ is bent at the notch 4G at right angles to the surface of the cover plate 30 in a bend 4C to form a straight leg projecting from the cover plate 30 on the side N.

Similarly, the terminal strip B is bent at the notches 5G and 5H in bends 5C and 5D as shown in FIG. 21 to form an elastic contact tongue 5A obliquely extending on the side M and a straight leg projecting at right angles to the cover plate 30 on the side N.

The curved parts 4B and 5B serving as contact ends may be formed by pressing in the process described with reference to FIG. 19.

As shown in FIG. 3, a case 20 having a sound radiating hole 7 in the central portion of the bottom wall thereof, an annular groove 2B in the inner circumference near the open end thereof and an annular ridge 2A may be formed similarly by injection molding. A piezoelectric element 6B is fixed adhesively to a metallic plate 6A by an anaerobic adhesive or the like.

Then, the metallic plate 6A fixedly mounted with the piezoelectric element 6B is placed on the annular ridge 2A of the case 20, and then the cover plate 30 is pressed into the case 20 to fit the flange 3A of the cover plate 30 into the annular groove 2B of the case 20 in an airtight fashion, so that the piezoelectric diaphragm 6 is held between the annular ridge 2A of the case 20 and the annular ridge 3B of the cover plate 30. The annular ridge 2A of the case 20 and the annular ridge 3B of the cover plate 30 are in line contact with the metallic plate 6A of the piezoelectric diaphragm 6.

As show in FIG. 3, the terminals 40 and 50 are positioned on opposite sides with respect to a diameter C of the cover plate 30 at distances $E_1$ and $E_2$ from the diameter C, respectively. Such disposition of the terminals 40 and 50 is shown in FIG. 4. The curved part 4B of the terminal 40 is in contact only with the piezoelectric element 6B, while the curved part 5B of the terminal 50 is in contact only with the metallic plate 6A as indicated by hatched areas in FIG. 5.

In forming the cover plate 30 integrally combined with the terminals 40 and 50 by insert molding, the notches 4G, 4H, 5G and 5H facilitate bending the metallic strips A and B to form the bends 4C, 4D, 5C and 5D. The positioning notches 4I and 5I prevent the dislocation of the terminals 40 and 50 relative to the cover plate 30. The terminals 40 and 50 may be provided each with a plurality of positioning notches in either side thereof. Although the present invention has been described as applied to a piezoelectric buzzer having two terminals, the present invention is applicable to a piezoelectric buzzer having more than two terminals.

What is claimed is:

1. A piezoelectric buzzer comprising:

a case having the shape of a bottomed cylinder with an open end, a piezoelectric diaphragm supported within said case in spaced parallel relationship with the bottom thereof, said diaphragm consisting of a circular metal plate having a piezolelectric element of smaller area than the metal plate adhesively attached to the surface of the plate which faces the open end of the case, a cover plate having exterior and interior surfaces sealingly fitted in the open end of said case having means on its interior surface for engaging said circular metal plate for fixedly supporting said piezoelectric diaphragm within said case, and first and second terminals each comprising an elongate elastic metal strip bent at least two spaced apart places to have a substantially straight intermediate portion, a leg extending from a first end of the intermediate portion disposed at a first angle with respect thereto and an elastic contact tongue extending from a second end of the intermediate portion disposed at an acute angle relative thereto, the intermediate portion of said first and second terminals being integrally molded within said cover plate and disposed in a common plane substantially parallel to the interior and exterior surfaces thereof and parallel to and equally spaced a predetermined distance from opposite sides of an imaginary line lying on a diameter of the cover plate, with said legs respectively projecting outwardly from the cover plate at points near opposite ends of said imaginary line, and with said elastic tongues projecting diagonally inward from the interior surface of the cover plate with the first elastically contacting said piezoelectric element and the second elastically contacting said metallic plate.

2. A piezoelectric buzzer according to claim 1, wherein said case is provided with an internally protruding annular ridge, said cover plate is provided with an internally protruding annular ridge, and the piezoelectric diaphragm is held between the annular ridges which are in line contact with the metal plate of the piezoelectric diaphragm.

3. A piezoelectric buzzer according to claim 1, wherein said case is provided with an internally protruding annular ridge, said cover plate is provided with an internally protruding annular ridge, the piezoelectric diaphragm is held between the annular ridges, and an elastic member is disposed between the annular ridge and the metal plate of the piezoelectric diaphragm.

4. A piezoelectric buzzer according to any one of claims 1, 2 and 3, wherein curved parts are formed in the free ends of the contact tongues of the terminals so as to be in contact with the piezoelectric element and the metal plate, respectively.

5. A piezoelectric buzzer according to claim 1, wherein an annular groove formed in the inner circumference of said case near the open end of the same, and a flange formed in the circumference of said cover plate form a fitting structure for joining said case and said cover plate firmly in an airtight fashion.

6. A piezoelectric buzzer according to claim 1, wherein a flange formed in the inner circumference of said case near the open end of the same, and an annular groove formed in the circumference of said cover plate form a fitting structure for joining said case and said cover plage firmly in an airtight fashion.

7. A piezoelectric buzzer according to claim 5, wherein the inner edge of the open end of the side wall of said case is chamfered to form a conical surface tapering toward the interior of said case.

* * * * *